United States Patent [19]

Kim et al.

[11] Patent Number: 5,631,183
[45] Date of Patent: May 20, 1997

[54] METHOD OF REDUCING WORD LINE RESISTANCE OF A SEMICONDUCTOR MEMORY

[75] Inventors: Hyeun-Su Kim, Suwon; Dong-Jae Lee, Seoul, both of Rep. of Korea

[73] Assignee: SamSung Electronics Co. Ltd., Suwon, Rep. of Korea

[21] Appl. No.: 473,984

[22] Filed: Jun. 7, 1995

Related U.S. Application Data

[62] Division of Ser. No. 983,475, Dec. 3, 1992, Pat. No. 5,467,316.

[30] Foreign Application Priority Data

Dec. 4, 1991 [KR] Rep. of Korea ............... 22107/1991

[51] Int. Cl.⁶ ............................................. H01L 21/70
[52] U.S. Cl. .......................... 438/239; 438/598; 438/587; 438/128
[58] Field of Search ........................ 437/51, 52, 47, 437/58, 59, 189, 193, 194, 48

[56] References Cited

U.S. PATENT DOCUMENTS

| | | |
|---|---|---|
| 4,883,980 | 11/1989 | Morimoto et al. |
| 4,906,872 | 3/1990 | Tanaka . |
| 4,926,378 | 5/1990 | Uchida . |
| 4,958,092 | 9/1990 | Tanaka . |
| 5,053,993 | 10/1991 | Miura . |
| 5,075,890 | 12/1991 | Itoh . |
| 5,097,440 | 3/1992 | Konishi et al. . |
| 5,097,441 | 3/1992 | Cho et al. . |
| 5,148,401 | 9/1992 | Sekino et al. . |
| 5,172,335 | 12/1992 | Sasaki et al. . |
| 5,457,064 | 10/1995 | Lee ............................. 437/52 |
| 5,460,990 | 10/1995 | Bergemont ................. 437/48 |
| 5,496,754 | 3/1996 | Bergemont et al. ....... 437/52 |
| 5,512,504 | 4/1996 | Wolstenholme et al. .. 437/48 |

FOREIGN PATENT DOCUMENTS

| | | |
|---|---|---|
| 1-245489 | 3/1988 | Japan . |
| 2-156666 | 12/1988 | Japan . |
| 3-235290 | 2/1990 | Japan . |

*Primary Examiner*—Tuan H. Nguyen
*Attorney, Agent, or Firm*—Robert E. Bushnell, Esq.

[57] ABSTRACT

A semiconductor memory device with a memory array of cells formed as a matrix has bit lines, and word lines driven by word line drivers, where each of the word line drivers simultaneously selects and drives at least two word lines in order to minimize line resistances of the word lines, thereby minimizing a delay time and improving a speed of sensing a cell data. Accordingly a number of the word line drivers is at least one-half a number of the word lines.

13 Claims, 6 Drawing Sheets

METHOD OF REDUCING WORD LINE RESISTANCE OF A SEMICONDUCTOR MEMORY

CROSS-REFERENCE TO RELATED APPLICATIONS

This application makes reference to, incorporates herein and claims all benefits available under 35 U.S.C. §119 and 120 from our application entitled *Device and Method of Reducing Word Line Resistance of a Semiconductor Memory* earlier filed in the Industrial Property Office of the Republic of Korea on Dec. 4, 1991 and there assigned Ser. No. 22107/1991, and the patent application of one of us entitled *Device and Method of Reducing Word Line Resistance of a Semiconductor Memory* earlier filed in the U.S. Patent & trademark Office on Dec. 3, 1992 and there assigned Division Ser. No. 07/983,475, now U.S. Pat. No. 5,467,316.

BACKGROUND OF THE INVENTION

The present invention relates to a semiconductor memory device, and more particularly, to an improved word line and driver structure for a dynamic random access memory with an open bit line structure.

Semiconductor memory devices are highly integrated; consequently, the most frequently adopted method for increasing the chip density within a restricted area is to minimize the size of the memory cell which includes one storage capacitor for storing data and one access transistor for transferring the data through bit lines. This however, causes a reduction of the pitch of the bit lines and the pitch of the word lines for selecting the memory cells, where the pitch is defined as the space between the lines. The area on which bit line selectors, bit line selection drivers, word line selectors, and word line selection drivers are arranged may be concomitantly and undesirably reduced however, thereby causing numerous problems. Generally, word line drivers are directly related to the sensing operation for the transfer of data by controlling the access transistor of the memory cell; accordingly, effective design and layout of the word line drivers is very important.

In a conventional folded bit line structure each of the word lines is coupled to a corresponding word line driver. The number of word line selectors is proportional to the number of the word line drivers with one word line selector connected to four word line drivers. The word lines in a group are connected to corresponding word line drivers, and the word line drivers are each controlled by a word line selector that is, in turn controlled by a word line selection signal. Such a conventional structure is difficult to design and layout in a semiconductor memory device using a design rule appropriate for design at a sub-micron level (e.g., for a very large scale integration memory device over the 64 megabyte level) of a dynamic random access memory. Furthermore, an increase in the density of the memory device lo requires reduction of the pitch between the word lines, thereby increasing the word line resistance. The word lines effect each other by noises generated from adjacent word lines which have their own specific resistances and junction capacitances.

A conventional semiconductor chip usually has first metal resistances arranged in parallel with the word lines. The width of the word lines, made of layers of polysilicon forming the gate electrodes of the single transistor memory cells, has been gradually reduced to obtain an increase in the density of the chip, thereby causing increased line resistance since resistance of the word line is inversely proportional to the width of the word line. A strap region indicates a region where a substance such as metal is arranged in the word lines, (i.e., strapped over a given length) in order to minimize the delay time of a transfer signal via the word lines. In addition, the word line resistances increase in proportion to the number of word lines on the chip, which consequently decreases the speed at which data stored in the memory cells may be sensed.

SUMMARY OF THE INVENTION

It is therefore, an object of the present invention to provide an improved word line and word line driver configuration, and a process for making the improved configuration.

It is another object to provide a word line, word line driver configuration, and process of manufacture that minimizes word line resistance.

It is yet another object to provide a word line, word line driver configuration, and process, able to select memory cells at an enhanced speed.

It is still another object to provide a word line, word line driver configuration, and process for manufacture, exhibiting reduced word line resistance and enhanced speed of memory cell selection.

It is still yet another object to provide a word line, word line driver configuration, and process for simultaneously selecting memory cells via adjacent pairs of word lines.

It is further an object to provide a process for making a semiconductor memory device for coupling an end of two word lines to enable connection of the coupled word lines to a single word line driver.

These and other objects may be achieved according to the principles of the present invention, with a semiconductor memory device using a memory array formed as a matrix having word lines and bit lines for selecting a memory cell. As contemplated, the device includes word lines and word line drivers so arranged that each of the word line drivers simultaneously selects and drives two adjacent word lines in order to minimize the line resistances of the word lines, thereby improving the speed of sensing the memory cell data. Accordingly, the number of word line drivers is one-half of the number of word lines formed on the chip.

The present invention will now be described more specifically with reference to the drawings attached, only by way of example of the principles of invention disclosed.

BRIEF DESCRIPTION OF THE ATTACHED DRAWINGS

DETAILED DESCRIPTION OF A PREFERRED EMBODIMENT

Figure 1:
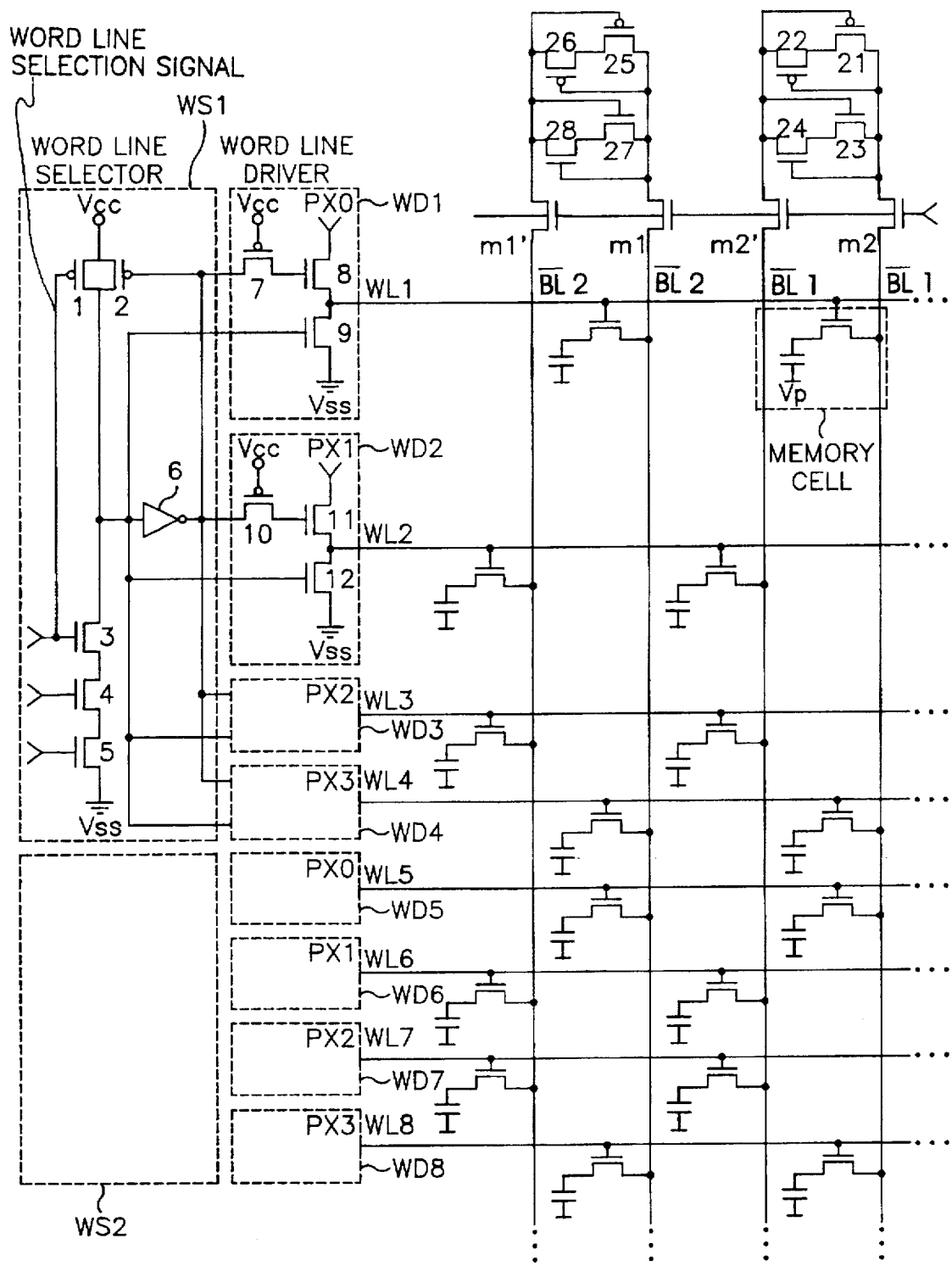
FIG. 1 shows the structure of the word lines and word line drivers constructed according to a conventional method.

FIG. 1 shows a memory device having a conventional folded bit line structure in which each of the word lines WL1, WL2, WL3, . . . WL8, is coupled to a corresponding word line driver WD1, WD2, WD3, . . . WD8. Moreover, the number of the word line selectors WS1, WS2 is proportional to the number of the word line drivers WD1, WD2, . . . WD8. As is shown in FIG. 1, one word line selector is connected to four word line drivers, and the word lines WL1, WL2, WL3 . . . WL8 in each group are respectively connected to different individual ones of the word line drivers WD1, WD2, WD3 . . . WD8, respectively. Each of the word line drivers is controlled by a word line selector that is, in turn, controlled by a word line selection signal. Such a structure is difficult to design and layout in a semiconductor memory device when using a design role appropriate for design of semiconductor devices at a sub-micron level such as a very large scale integration memory device on the order of, or greater than a 64 megabyte dynamic random access memory. Furthermore, an increase of the density of the memory device requires reduction of the pitch between the word lines, which concomitantly increases the word line resistance. It should be noted that the word lines effect each other by noise generated by adjacent word lines having their own specific resistances and junction capacitances.

Figure 2:
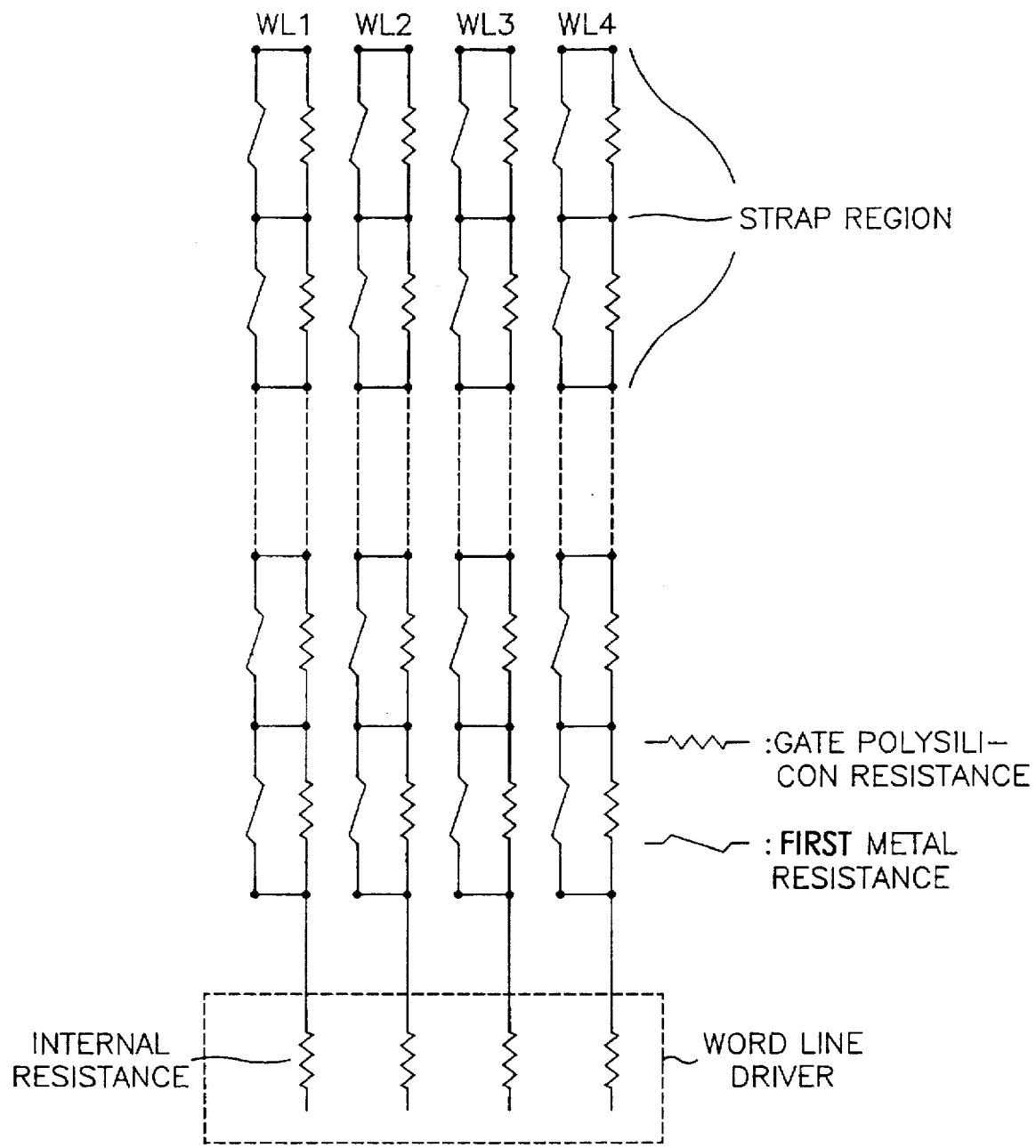
FIG. 2 is a schematic diagram illustrating resistance components of the word lines shown in FIG. 1.

As is shown in FIG. 2, a semiconductor chip usually has a plurality of serially connected first metal resistances $R_m$ formed by first metal layers deposited in parallel with corresponding polycyrstalline silicon layers (i.e., polysilicon) forming the gate electrode terminals of the single transistors of the memory cells shown in FIG. 1 coupled to the word lines. The widths of the word lines, defined by the gate polysilicon layers, are gradually reduced with an increase in the density of the chip, causing thereby increased line resistance since resistance of the word line is inversely proportional to the width of the word line. A strap region indicates a length of the word line where a substance such as a layer of metal deposited in the word lines, is strapped over a given length of the corresponding word line in order to minimize delay time of a transfer signal via the word lines. In addition, the word line resistances increase in proportion to the number of word lines on the chip, which consequently decreases the speed of sensing data stored in the memory cells.

Figure 3:
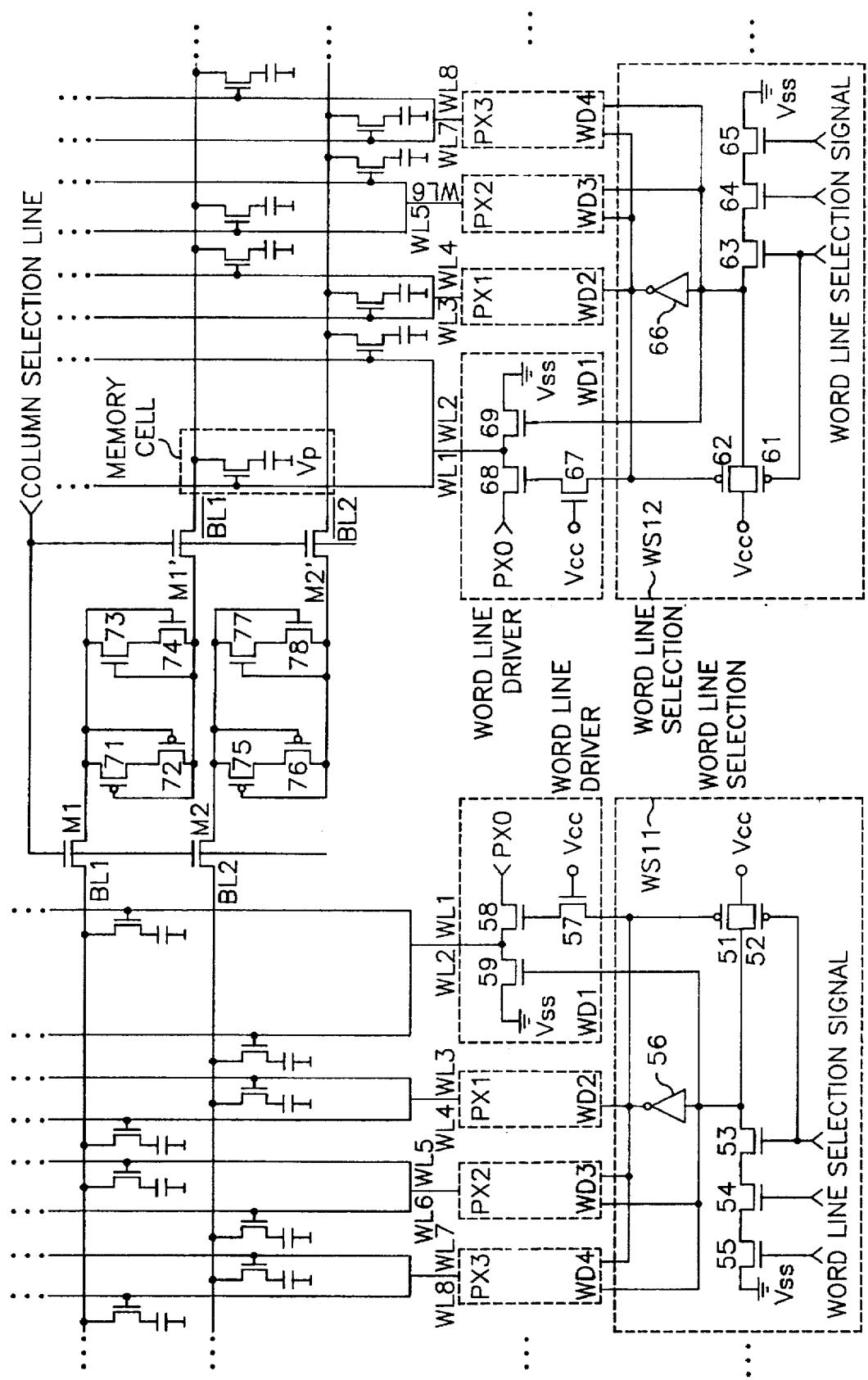
FIG. 3 shows a structure of the word lines and word line drivers as constructed according to the principles of the present invention.

Referring now to FIG. 3, it should be noted that the principles of the present invention may be applied to a semiconductor memory device of the type having an open bit line structure. The internal circuit structure of the word line selectors WS11, WS12, . . . and word line drivers WD1, WD2, WD3, . . . is the same as those of FIG. 1, and therefore the descriptions for those word line selectors and word line drivers need not be repeated here. One key feature of the present invention is that one word line driver is able to select and drive one of two word lines, thereby reducing word line resistance while concomitantly reducing the number of word line drivers needed in a semiconductor memory device.

Figure 5:
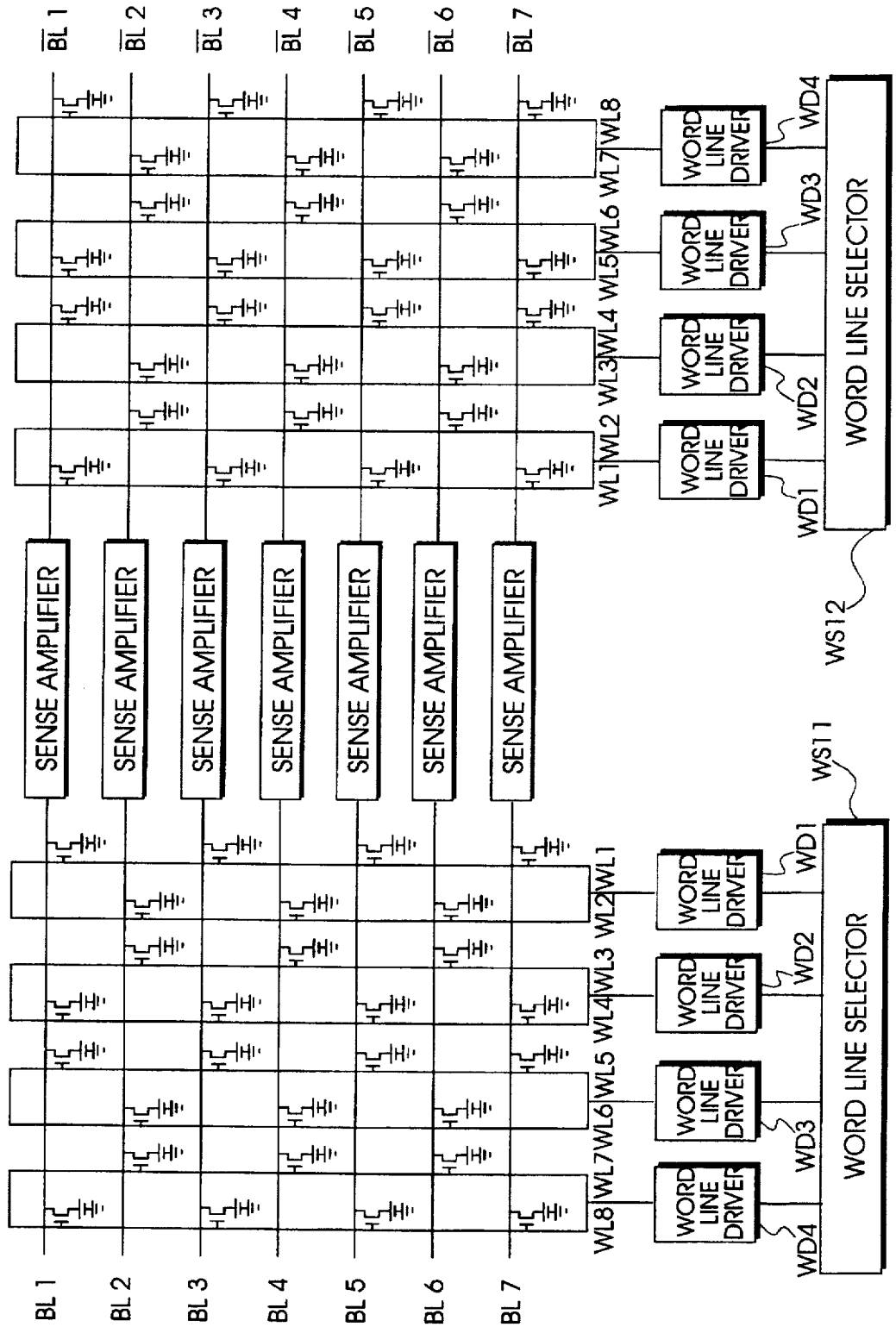
FIG. 5 illustrates a plan view on a memory cell matrix constructed according to the principles of the present invention.

In the device represented by FIGS. 3 and 5, a column selector line signal selects one of the sense amplifiers 71, 72, 73, . . . 78 respectively connected to a number of memory cells in the column. The memory cells are arranged in a matrix array, and are connected with corresponding selected word lines. The selected sense amplifier senses, in a conventional manner, data stored in the memory cell located where the bit line connected to the sense amplifier intersects with the selected word line. In this embodiment, one word line selector in a group of word line selectors may be selected by a combination of word line select signals, and the word line which is selected can, in turn, select four word line drivers. When a word line driver such as WD1 is activated, two word lines WL1 and WL2 are selected at the same time. In like manner, if word line driver WD2 is activated, word lines WL3 and WL4 are selected. Data stored in the single transistor memory cells having gate electrodes coupled to word lines WL1, WL2 are transferred to the corresponding sense amplifiers formed by transistors 75–78 and 71–74, respectively, at the same time, and unwanted data stored in the memory cells in word line WL2, for example, may be eliminated with peripheral circuitry (not shown in FIGS. 3 and 5).

In the word line selector WS12, transistors 63, 64, 64 are all turned to an electrically conducting ON state by a binary selection signal of 111 applied to the gate electrodes of transistors 63, 64, 65, to enable selection of word lines WL1, WL2. After a short interval, if a binary selection signal 000 is applied to transistors 63, 64, 65, transistors 61, 62 are turned to an electrically conducting ON state, while inverter 66 and transistor 62 form a latch circuit to maintain the current logic state. Transistor 69 is turned to either an electrically conducting ON state or to an electrically non-conducting OFF state according to the logic state of the signal applied to the gate electrode of transistor 69. At this time, word line driver stage WD1 is not turned ON because transistor 69 is turned to an electrically conducting ON state. Subsequently however, if the binary selection signal 111 is again applied to the gate electrodes of transistors 63, 64, 65, word line driver WD1 will be activated because transistors 61, 62 and 69 will be turned to an electrically non-conducting OFF state while transistor 68 will be in an electrically conducting ON state.

Figure 4:
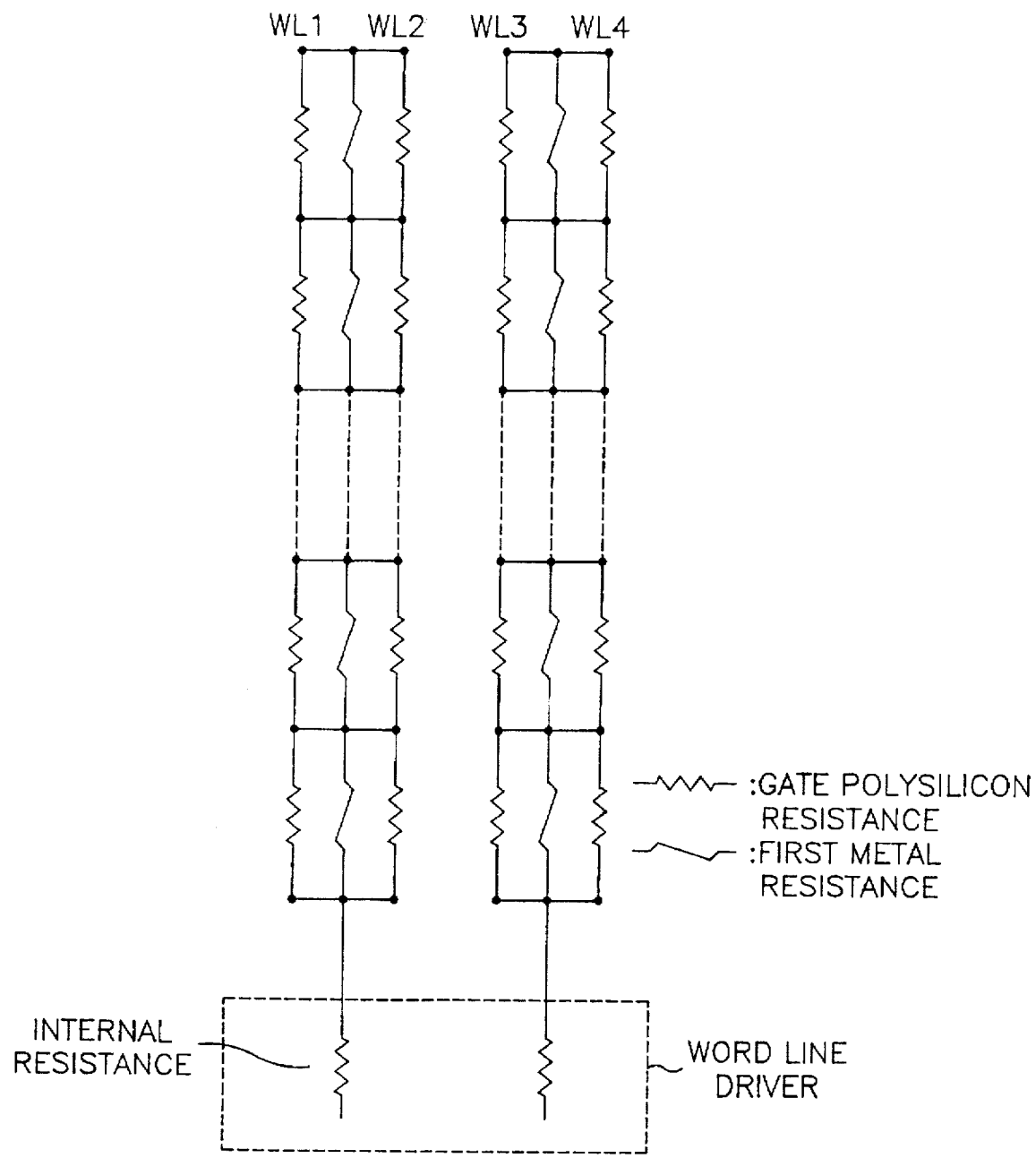
FIG. 4 is a schematic diagram illustrating the resistance components of the word lines of as shown FIG. 3.

It can be therefore readily appreciated that the improved word line and word line driver configuration constructed according to the present invention contemplates respectively connecting at least two corresponding word lines to a single driver in order to reduce the line resistance of the word lines, in response to the word line driver selection signals PX0, PX1, PX2, PX3 (of which only PX0 is shown) that are applied to the four word line drivers in the same group. By way of explanation, if the width of each one of the word lines, and the spacing between each of the word lines, are all identical in their dimensions, the line resistance between the word line straps is reduced to one third of the resistance of the conventional circuit having the same cell size and design rule, as is shown in FIG. 4, because when a word line driver is connected to two word lines, the resistance of the gate polycrystalline silicon layer is reduced to one-half of the resistance of the conventional circuit as shown in FIG. 1 by being coupled in parallel with the gate polycrystalline electrode of another memory cell coupled to the adjacent word line. Hence, due to this reduction in the effective resistance of the word lines, the delay time of the word line signal is minimized, which in turn, increases the speed of data sensing.

Figure 6A:
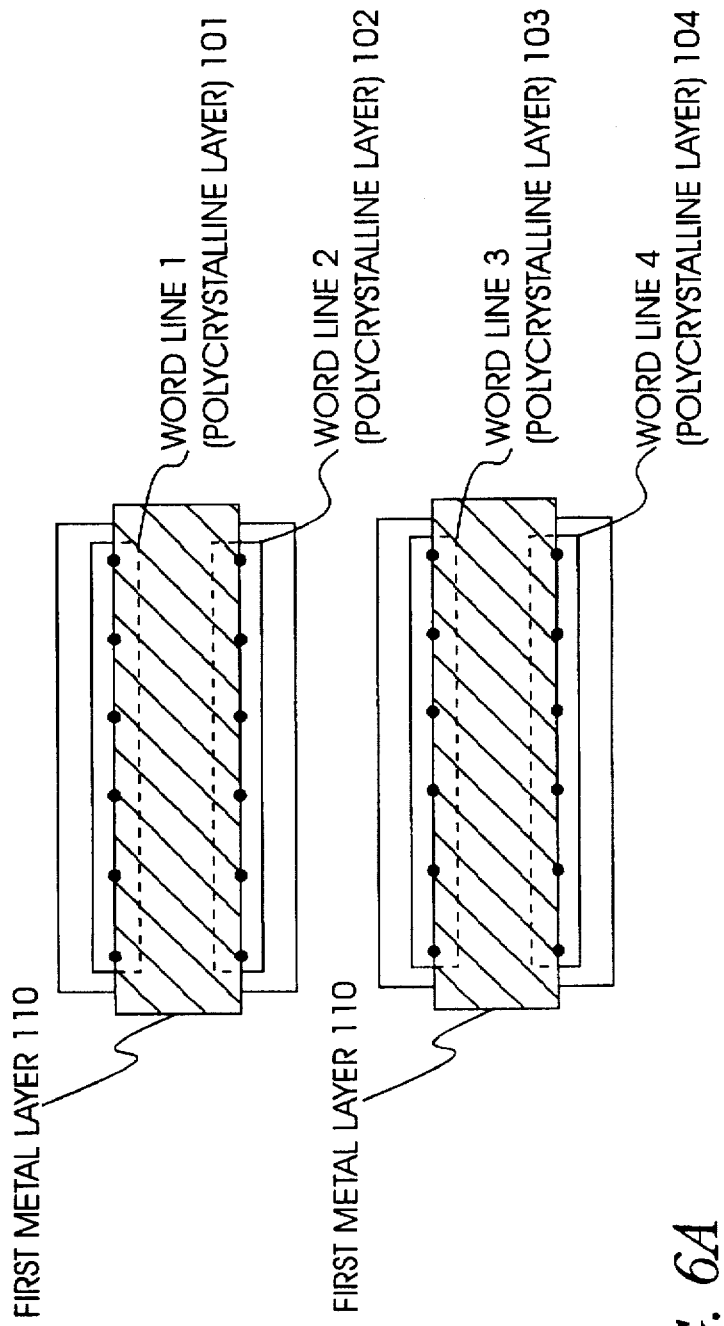
FIG. 6A illustrates an abstract representational plan view showing a detail in the fabrication of pairs of parallel word lines.
Figure 6B:
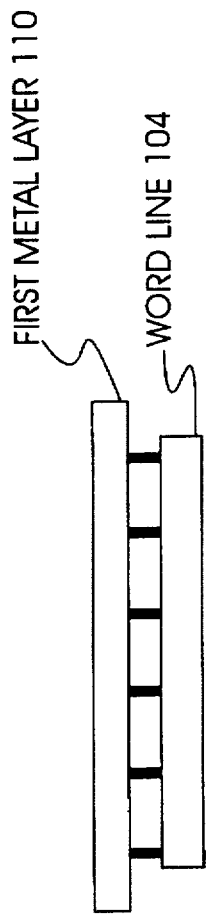
FIG. 6B illustrates a side view of the detail represented by FIG. 6A.

Turning now to FIGS. 6A and 6B, a process for making a semiconductor memory device which has an open bit structure, comprises of the steps of forming adjacent pairs of word lines with polycrystalline layers 101, 102, and 103, 104 of, for example, polycrystalline silicon, each comprising a plurality of serially coupled layers of polycrystalline silicon forming gate electrodes of a plurality of transistor memory cells. First metal layer 110 is formed, to extend substantially parallel to corresponding adjacent pairs of word lines 101,102 and 103, 104, with adjacent, parallel lengths of metal layer 110 coupling each of the adjacent pairs of word lines to a different single word line driver. WD1 . . . WD4. In essence, first metal layer 110 is deposited to form the word line proper that serially couples the polycrystalline silicon gate electrodes of the single transistors along each word line.

Although the present invention has been described with reference to one preferred embodiment, it will be readily appreciated by one skilled in this technical field that various modifications and changes may be made to the described embodiment without departing from the scope of the invention.

What is claimed is:

1. A process for making a semiconductor memory device having an open bit structure, comprising the steps of:

forming adjacent pair of word lines each comprised of a plurality of serially coupled layers of polycrystalline silicon forming gate electrodes of a plurality of transistor memory cells;

forming layers of metal extending substantially parallel to said adjacent pairs of word lines; and coupling each said adjacent pair of word lines to a different single word line driver.

2. The process of claim 1, further comprised of connecting said adjacent pairs of word lines and said layers of metal between each successive pair of adjacent memory cells along said adjacent word lines.

3. A process of making a semiconductor memory device having an open bit structure, comprising the steps of:

forming a plurality of adjacent pairs of word lines with an electrical connection between each said adjacent pair of word lines; and connecting a different, single word line drivers to each said pair of word lines to enable each said different single word line driver to simultaneously drive corresponding said pair of word lines and to enable each said different single word line driver to drive one of the word lines of each said pair of adjacent word lines in response to corresponding selected word line signals, said one of said plurality of word lines exhibiting a reduced resistance.

4. The process of claim 3, further comprised of forming said plurality of adjacent pairs of word lines with polycrystalline silicon layers forming serially coupled gate electrodes of memory cells within a memory array formed as a matrix.

5. The process of claim 4, further comprised of depositing layers of metal forming electrical shunts between different corresponding successive lengths of said polysilicon layers within each of said pair of adjacent word lines.

6. The process of claim 3, further comprised of forming said plurality of adjacent pairs of word lines by:

forming adjacent pairs of word lines each comprised of a plurality of serially coupled layers of polycrystalline silicon forming gate electrodes of a plurality of transistor memory cells; and forming layers of metal extending substantially parallel to said adjacent pairs of word lines.

7. A process of forming a semiconductor memory device, comprising the steps of:

forming a matrix of memory cells with a plurality of word lines, each one of said plurality of word lines capable of accessing a different plurality of said memory cells; and connecting a different, single word line driver to at least two adjacent word lines from said plurality of word lines for enabling said single word line driver to select and drive said two adjacent word lines connected in parallel.

8. The process of claim 7, wherein each of said plurality of word lines is formed by:

depositing polysilicon layers forming serially coupled gate electrodes of memory cells within said matrix of memory cells; and depositing metal layers forming electrical shunts between different corresponding successive lengths of said polysilicon layers within each of said at least two of said plurality of word lines.

9. The process of making a semiconductor memory device having an open bit line structure, comprising the steps:

forming a memory array of memory cells;

forming a first word line comprising a plurality of first, serially coupled word line resistances to access a first plurality of memory cells in said memory array;

forming a second word line comprising a plurality of second, serially coupled word line resistances to access a second plurality of memory cells in said memory array different from said first plurality of memory cells; and connecting a single word line driver to one end of said first word line and said second word line, for enabling said single word line driver to drive one of said first word line and said second word line in response to a word line selection signal and a driver selection signal.

10. The process of claim 9, wherein each of said first and second word lines is formed by:

depositing polysilicon layers forming serially coupled gate electrodes of memory cells within said memory array; and depositing metal layers forming electrical shunts between different corresponding successive lengths of said polysilicon layers within each of said first and second word lines.

11. A process of making a memory device, comprising the steps:

forming a memory array of memory cells;

forming successive pairs of first and second word lines each pair comprised of a plurality of first layers of a first material forming gate electrodes of the memory cells in said memory array and a second layer of a second material extending substantially parallel to, and being connected to each pair of said first and second word lines; and connecting a single word line driver to said second layer of said second material for communication with each pair of said first and second word lines, for enabling said single word line driver to drive one of said first word line and said second word line during operation of said memory device.

12. The process of claim 11, further comprised of each pair of said first and second word lines being formed by:

depositing said plurality of first layers of polycrystalline silicon forming serially coupled gate electrodes of the memory cells within said memory array; and depositing said second layer of metal forming electrical shunts between different corresponding successive lengths of said first layers of polycrystalline silicon of each pair of said first and second word lines.

13. The process of claim 11, further comprised of said first layers of said first material comprising polycrystalline silicon resistance and said second layer of said second material comprising metal resistance.

* * * * *

UNITED STATES PATENT AND TRADEMARK OFFICE
CERTIFICATE OF CORRECTION

PATENT NO. : 5,631,183
DATED : May 20, 1997
INVENTOR(S) : Hyeun-Su Kim

It is certified that error appears in the above-indentified patent and that said Letters Patent is hereby corrected as shown below:

Column 1, Line 53, after "device", delete "1o".

Signed and Sealed this

Twenty-ninth Day of July, 1997

Attest:

BRUCE LEHMAN

*Attesting Officer*　　　*Commissioner of Patents and Trademarks*